United States Patent [19]

Asami

[11] 4,366,398
[45] Dec. 28, 1982

[54] AMPLIFIER CIRCUIT

[75] Inventor: Fumitaka Asami, Kunitachi, Japan

[73] Assignee: Fujitsu Limited, Kawasaki, Japan

[21] Appl. No.: 201,387

[22] PCT Filed: Nov. 6, 1979

[86] PCT No.: PCT/JP79/00285
§ 371 Date: Jul. 17, 1980
§ 102(e) Date: Jul. 3, 1980

[87] PCT Pub. No.: WO80/01124
PCT Pub. Date: May 29, 1980

[30] Foreign Application Priority Data
Nov. 17, 1978 [JP] Japan .................................. 53-142533

[51] Int. Cl.³ .............................................. H03K 19/40
[52] U.S. Cl. ..................... 307/451; 330/264; 331/25
[58] Field of Search ................ 330/264; 307/451, 452, 307/469; 331/116 FE, 25

[56] References Cited

U.S. PATENT DOCUMENTS 4,201,945 5/1980 Ohgishi et al. .................. 331/25 X

FOREIGN PATENT DOCUMENTS 53-3154 1/1978 Japan ........................... 331/116 FE
53-34448 3/1978 Japan ........................... 331/116 FE Primary Examiner—James B. Mullins
Attorney, Agent, or Firm—Staas & Halsey

[57] ABSTRACT

An amplifier circuit composed of two cascade-connected inverter stages, each of which consists of p channel and n channel transistors connected at their drains, n channel and p channel transistors which connect the gates of the, transistors of the first inverter to their respective drains by means of the control signal while said amplifier circuit is operated, and n channel and p channel transistors which connect the gates of both transistors of the first inverter respectively to specified potentials which set both transistors at the cut-off condition by means of the control signal while said amplifier circuit is not operated.

10 Claims, 4 Drawing Figures

AMPLIFIER CIRCUIT

DESCRIPTION

1. Technical Field

This invention relates to an amplifier circuit, and in more detail to an amplifier circuit wherein a couple of inverters are cascade-connected and the second inverter is biased so that the highest gain is obtained, by connecting the input and output terminals of the first inverter through a resistor (including the case where resistance is zero).

2. Background Art

A conventional amplifier circuit using a couple of inverters is shown in FIG. 1.

In FIG. 1, an input signal at the input terminal $T_I$ is applied to the input of inverter $I_1$ via the capacitor $C_1$. The input and output terminals of inverter I, are connected via the resistor $R_1$. The output of the inverter $I_1$ is provided to the terminal $T_0$ via the inverter $I_2$.

The relation between the input and output of each inverter forming such an amplifier circuit is shown in FIG. 2.

In FIG. 2, A shows the relation between the input $V_{I-1}$ and output $V_{O-1}$ of the inverter $I_1$. The input-output characteristic A of the inverter $I_1$ is generally expressed by a straight line since a negative feedback loop is formed for the inverter $I_1$. Particularly, when the resistance $R_1$ is zero (0), $V_{I-1}$ becomes equal to $V_{O-1}$, and the characteristic A becomes a straight line having inclination of 45°. On the other hand, B shows the relation between the input $V_{I-2}$ and output $V_{O-2}$ of the inverter $I_2$. The gain of inverter $I_2$ is very high since it has no feedback loop. As is apparent from the FIG. 1, $V_{O-1}$ equals $V_{I-2}$.

A point C at the intersection of both characteristics of A and B indicates the bias point of the input of the inverter $I_2$, and it is shown that the point C is set to the center of the characteristic B where the highest gain can be obtained by making the resistance $R_1$ zero. Therefore, a large variation in the output $V_{O-2}$ can be extracted from a small change of the input $V_{I-1}$. As explained above, an amplifier circuit can be realized wherein the inverter is used in such a condition that the gain becomes the maximum. The same characteristics can easily be provided for both inverters, for example when CMOS is used, by making the gain constants $\beta$ of the inverters equal. By the way, fantastic progress in the manufacturing technology of semiconductor devices has promoted high integration of semiconductor elements to such a degree that circuits having different functions which previously had been formed on individual semiconductor chips are now formed on the same semiconductor chip.

For example, consider the integrated circuits which might be used in a car radio receiver and timer (particularly a digital clock) which are mounted in a vehicle. A car radio receiver may include a phase locked loop (generally called PLL) circuit for tuning, and this PLL circuit has a frequency divider which converts an oscillation signal sent from a crystal controlled oscillator to the desired frequency and an input amplifier circuit having the aforementioned construction in order to generate a local oscillation signal.

Formation of the PLL circuit composed of circuits having different functions onto the same semiconductor chip facilitates the manufacture of a car radio.

On the other hand, a clock also requires a crystal controlled oscillator to generate a stabilized oscillation frequency and a divider for obtaining the desired frequency signal, in order to sequentially operate a counter.

Thus total construction can be simplified by using the crystal controlled oscillator and a part of the divider in common for both a car radio and the clock.

But, there is a large difference in how car radios and clocks are used. A car radio, for example, is switched on when the driver or other person desires to listen to a radio program, and is switched off when he is going to leave the car. On the other hand, a clock must always operate without relation to the driver or other person's attendance, and it is glanced at only for convenience when one desires to know the present time.

For this reason, when using the divider circuit a PLL circuit in common for a car radio and timer, the power supply of the integrated circuit must not be switched off even when a driver or other person is not listening to the car radio.

But, if the input amplifier circuit of this PLL circuit is composed of CMOS (Complimentary Metal Oxide Semiconductor), the p channel transistors and n channel transistors in each inverter and the internal circuits simultaneously become conductive, allowing a steady current to flow, so that the input amplifier circuit consumes much electrical power even when the car radio is not operated. This is a serious disadvantage for car electronics devices which use a battery as the power supply.

DISCLOSURE OF INVENTION

It is an object of the present invention to offer an amplifier circuit that can reduce power consumption without switching off the power source of said element when it is not operated.

According to the present invention, provided is an amplifier circuit composed of cascade-connected first and second inverters, in each of which the p channel and n channel transistors are connected in series, first and second control transistors which become conductive when a specified control voltage is applied and which connect the gates of both transistors forming said first inverter to their respective drains, the third and fourth control transistors which become conductive when said specified control voltage is not applied and which connect the gates of both transistors forming said first inverter to the power supply or the ground respectively, and a fifth transistor which becomes conductive when said specified control voltage is not applied and which fixes the gates of both transistors forming said second inverter to the power source or ground potential, so that power consumption can be drastically reduced without switching off the power supply while the amplifier is not being operated.

BEST MODE FOR CARRYING OUT THE INVENTION

A preferred embodiment of the present invention will be explained hereunder by referring to FIG. 3.

Figure 3:
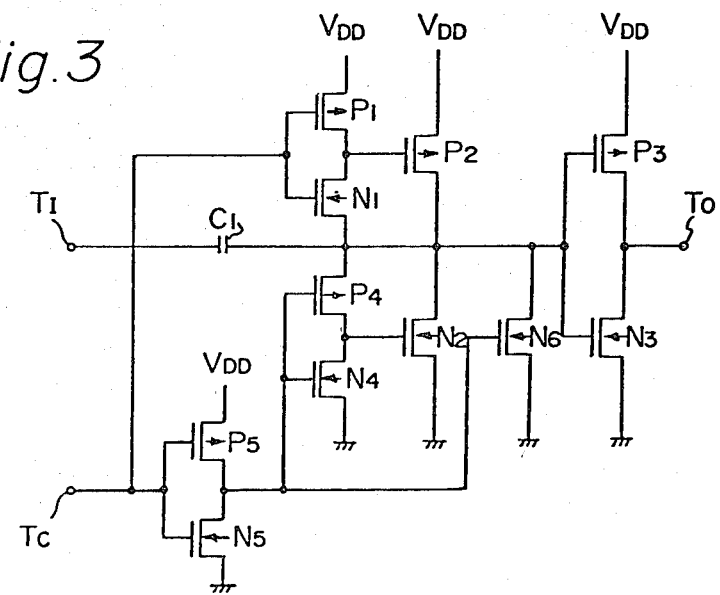
FIG. 3 shows a schematic diagram indicating the construction of an embodiment of the amplifier circuit of the present invention.

In FIG. 3, $P_1$, $P_2$, $P_3$, $P_4$ and $P_5$ denote p channel transistors; $N_1$, $N_2$, $N_3$, $N_4$, $N_5$ and $N_6$ denote n channel transistors; $C_1$ denotes a capacitor; $T_1$ denotes an input terminal; $T_O$ denotes an output terminal; $T_c$ denotes a control terminal, $V_{DD}$ denotes a positive power supply.

Transistors $P_2$, $N_2$ and $P_3$, $N_3$ are so configured that the gain constant $\beta$ becomes equal respectively. The transistors $P_2$ and $N_2$ operate as the first inverter, while the transistors $P_3$ and $N_3$ operate as the second inverter.

Figure 1:
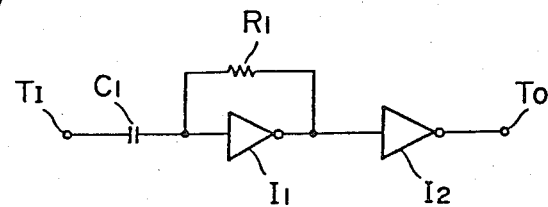
FIG. 1 shows the construction of an existing amplifier using inverters.
Figure 2:
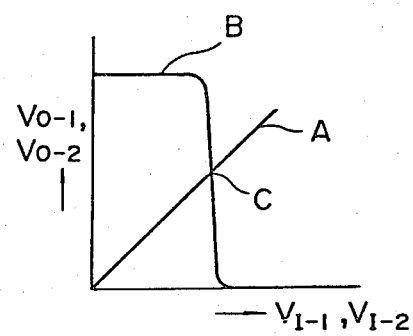
FIG. 2 shows characteristics indicating the relation between the input and output of the amplifier circuit shown in FIG. 1.

The construction where the gates of transistors $P_2$ and $N_2$ of the first inverter are connected to their respective drains is a more practical version of the existing amplifier circuit shown in FIG. 1. In contrast to the existing amplifier circuit, the amplifier of the present invention comprises first and second control transistors $N_1$ and $P_4$ which become conductive when the specified control signal is applied to the control terminal $T_c$ and which connect the gates of transistors $P_2$ and $N_2$ (which form the first inverter to their respective drains); third and fourth control transistors $P_1$ and $N_4$ which become conductive when the specified control signal is at a low level and which connect the gates of transistors $P_2$ and $N_2$ (which form said first inverter) respectively to the power supply $V_{DD}$ or ground; fifth transistor $N_6$ which becomes conductive when said control signal is at a low level and which fixes the gates of transistors $P_3$ and $N_3$ (which form the second inverter) to the ground potential (or power supply voltage $V_{DD}$); and an inverter consisting of transistors $P_5$ and $N_5$ which operates these transistors as mentioned above.

In order to operate the circuit as shown in FIG. 3 as an amplifier, a high level signal is applied to the control terminal $T_c$. Thereby, the transistors $N_1$ and $P_4$ becomes conductive, connecting the gates of transistors $P_2$ and $N_2$ to their respective drains. Therefore, the input and output of the first inverter consisting of transistors $P_2$ and $N_2$ are connected and thereby the input voltage becomes equal to the output voltage as in the case of the inverter $I_1$ in FIG. 1. Since the first inverter, consisting of transistors $P_2$ and $N_2$ and the second inverter, consisting of transistors $P_3$ and $N_3$ have the same gain consistant $\beta$, the second inverter is so biased that the highest gain is obtained, as in the case of the above explanation, and operates as the required input amplifier.

To discontinue operation as an amplifier, a low level signal is applied to the control terminal $T_c$. Thereby, the output of the inverter consisting of transistors $P_5$ and $N_5$ becomes high. Therefore, transistors $P_1$ and $N_4$ become conductive, setting transistors $N_1$ and $P_4$ at the cut-off condition. Thus, the gates of transistors $P_2$ and $N_2$ are set at the cut-off condition because these gates are connected to the power source $V_{DD}$ and ground respectively, so that a current does not flow between the power supply and ground via the first inverter.

Simultaneously, the transistor $N_6$ becomes conductive and an input of the second inverter, consisting of transistors $P_3$ and $N_3$, becomes low, so that the output of the second inverter at the terminal $T_O$ is fixed at a high level. Accordingly, no current flows between the power supply and ground via the second inverter.

Moreover, no current flows in the circuits connected following the output terminal $T_O$. The transistor $N_6$ prevents, as mentioned previously, current from flowing between the power supply and ground via the second inverter, consisting of transistors $P_3$ and $N_3$ because the potential at the interim point of transistors $P_2$ and $N_2$ becomes unstable due to the cut-off of transistors $P_2$ and $N_2$. Therefore, the output of the second inverter at the terminal $T_O$ may alternately be set to a low level by connecting the transistor $N_6$ between the interim point of transistors $P_2$ and $N_2$ and the power supply, with the input of second inverter, consisting of transistors $P_3$ and $N_3$ being set at a high level while the transistor $N_6$ is conductive.

When the output of the terminal $T_O$ is thus set at a high level or low level, one of the CMOS P channel and n channel transistors is set in the cut-off condition and, in case the circuit connected following this amplifier circuit uses CMOS, power consumption can be reduced. Accordingly, the present invention is particularly effective when adopted into an integrated circuit device constructed by using a CMOS.

Figure 4:
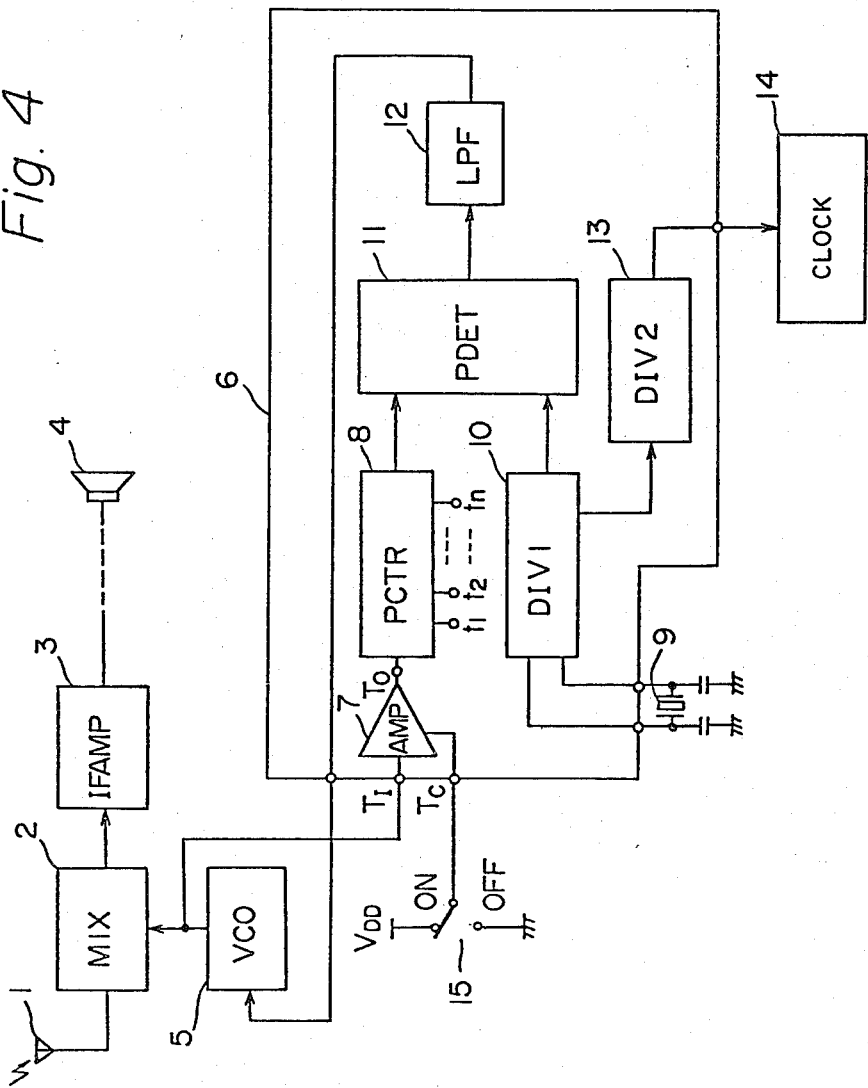
FIG. 4 shows a schematic diagram of a radio receiver circuit wherein the amplifier circuit shown in FIG. 3 is adopted.

FIG. 4 is the preferred embodiment of a circuit adopting the amplifier circuit shown in FIG. 3, and particularly a divider circuit of the PLL circuit of a radio receiver which is used in common as a part of the divider circuit of a clock.

The PLL circuit comprises a voltage controlled oscillator 5, input amplifier circuit 7, program counter 8, crystal controlled oscillator 9, divider circuit 10, phase detection circuit 11 and low pass filter 12.

In the program counter 8 of the PLL circuit, when a listener selects a program, a signal is applied to the specified terminal according to the selected program (broadcasting station) among the terminals $t_1$, $t_2 \ldots t_n$, and the dividing ratio of the program counter is set.

The input signal is frequency-converted in accordance with the signal applied to the terminal $t_1$, $t_2$, . . . , $t_n$ by means of the program counter and is then subjected to phase comparison at the phase detection circuit 11 with a signal obtained by dividing the output of crystal controlled oscillator 9.

If the output frequency of the voltage controlled oscillator 5 varies from the frequency of the specified local oscillation signal, an output is detected from the phase detection circuit 11 and it is then given to the voltage controlled oscillator 5 via a low pass filter 12.

Therefore, the voltage controlled oscillator 5 is controlled by said detected output, causing the output frequency to be shifted to the specified local oscillation signal frequency.

Since a stable local oscillation signal is thus given to the mixer 2, a broadcast signal received through the antenna 1 is processed for delivery to loud speaker 4 via an ordinary receiving circuit, comprising the mixer 2 and intermediate frequency amplifier circuit 3 etc. On the other hand, the crystal controlled oscillator 9 in this PLL circuit is also used as the pulse generation source of a clock.

A signal sent from the crystal controlled oscillator 9 is supplied to said divider circuit 10, and its output is then supplied to the phase detection circuit 11 as already been explained. The desired divided signal is also supplied to the divider circuit 13 and is further divided in frequency to a 1-second clock signal which drives clock circuit 14.

Although not illustrated, in the clock circuit 14, the counter receives said clock signal of 1-second period and simultaneously an indicator, using liquid crystal, displays the content of counter.

If the elements of block 6, including input amplifier circuit 7, program counter 8, divider circuits 10 and 13, phase detection circuit 11 and low pass filter 12 are formed on the same semiconductor chip during circuit construction, the power source applied to the chip cannot be turned OFF because the divider circuits 10, and 13 must be operated even while the radio receiver is not in use.

The amplifier circuit of the present invention shown in FIG. 3, can be used as input amplifier circuit 7 by connecting the input terminal $T_I$ to the output terminal of the voltage controlled oscillator 5 while the output terminal $T_O$ is connected to the input terminal of program counter 8, so that the amplifier circuit can be set to a non-operative condition by inputting a low level signal to the control terminal $T_c$ when the radio is not being used in order that power consumption can be reduced without switching off the power supply.

Here, the control signal to be applied to the control terminal can be produced by using, for example, the power switch 15 of the radio receiver, as shown in FIG. 4. When the power switch is turned ON, the movable contact of switch 15 is set to the ON side and a power source voltage $V_{DD}$ (high level) is applied to the control terminal $T_c$, while if the power switch is turned OFF, movable contact of switch 15 is set to OFF the side and a ground potential (low level) is applied to the control terminal $T_c$. Moreover, it is also possible to introduce other tactics in addition to the power switch, such as applying a high level signal to the control terminal $T_c$ when the start key of the vehicle is keyed on, an applying a low level signal when the start key is removed.

As explained above, the amplifier circuit of the present invention is capable of exhibiting the following excellent effects: it operates as an amplifier circuit using an inverter when a high level signal is applied to the control terminal and does not operate as an amplifier when a low level signal is applied to the control terminal; it prevents unnecessary current from flowing between the power supply and ground via the inverter when the amplifier circuit is not in use; and it thereby prevents unwanted power consumption when it is not operated as an amplifier.

I claim:

1. An improved amplifier circuit of the type including a cascade connection of first and second inverters, each of which consists of series connected p channel and n channel transistors, with the amplifier having an input port connected to the input of the first inverter for receiving a signal to be amplified and having an output port connected to the output of the second inverter for delivering an amplified signal, wherein the improvement comprises: first means for connecting the gates of both transistors of said first inverter to their respective drains when said amplifier is being operated; second means for connecting said gates of both transistors of said first inverter to potentials which set said both transistors of said first inverter at their cut-off conditions when said amplifier is not operated; and control port means for receiving a control signal for controlling the first and second means.

2. An amplifier circuit as claimed in claim 1, further comprising third means which sets said p channel and n channel transistors forming the second inverter at their cut-off conditions while said amplifier circuit is not operated.

3. An amplifier circuit as claimed in claim 1, wherein said first means comprises a couple of transistors, one of which is connected between the gate of said p channel transistor and the input line of said first inverter, the other of which is connected between the gate of said n channel transistor and the input line of said first inverter.

4. An amplifier circuit as claimed in claim 1, wherein said second means comprises a couple of transistors connected between the gates of said p channel and n channel transistors of said first inverter and one of the power supply and ground.

5. An amplifier circuit as claimed in claim 2, wherein said third means comprises a transistor connected between the input line of said second inverter and one of the power supply and ground.

6. An amplifier circuit having an input port for receiving a signal to be amplified, an output port for delivering the amplified signal to subsequent circuitry, and a control port for receiving a control signal to selectively render the amplifier operative and inoperative, comprising:

means for receiving power from a power supply;
a first p channel transistor and a first n channel transistor series-connected, at a first intermediate connection point, between said means for receiving power and ground;
an input element and means for conveying a feedback signal series-connected, at a second intermediate connection point, between said input port and said first intermediate connection point;
a second p channel transistor and a second n channel transistor series-connected, at a third intermediate connection point, between said means for receiving power and said second intermediate connection point, the gate of one of said first transistors being connected to said third intermediate connection point and the gates of both second transistors being connected to said control port;
a third p channel transistor and a third n channel transistor series connected, at a fourth intermediate connection point, between said means for receiving power and ground, the gates of both third transistors being connected to said control port;
a fourth p channel transistor and a fourth n channel transistor series connected, at a fifth intermediate connection point, between said second intermediate connection point and ground, the gate of the other of said first transistors being connected to said fifth intermediate connection point and the gates of both fourth transistors being connected to said fourth intermediate connection point; and
means connected to said first intermediate connection point for providing an output signal at said output port.

7. The circuit of claim 6, wherein said means connected to said first intermediate connection point comprises a fifth p channel transistor and a fifth n channel transistor series connected, at a sixth intermediate connection point, between said means for supplying power and ground, said sixth intermediate connection point being connected to said output port and the gates of both fifth transistors being connected to said first intermediate connection point.

8. The circuit of claim 6 or 7, further comprising an additional transistor connected between said first intermediate connection point and one of said means for receiving power and ground, the gate of said additional transistor being connected to said fourth intermediate connection point.

9. The circuit of claim 8, wherein said means for conveying feedback signal is a conductor.

10. The circuit of claim 8, wherein said first, second, third, fourth, and additional transistors are all fabricated on the same substrate that additionally includes first divider means for supplying a signal to a phase detector in a phase locked loop which includes said amplifier circuit, and second divider means responsive to said first divider means for generating a signal to drive a digital clock.

* * * * *

UNITED STATES PATENT AND TRADEMARK OFFICE
CERTIFICATE OF CORRECTION

PATENT NO. : 4,366,398

DATED : December 28, 1982

INVENTOR(S) : Asami

Page 1 of 2

It is certified that error appears in the above-identified patent and that said Letters Patent is hereby corrected as shown below:

Front page [57] Abstract, line 5, delete --,--.

Col. 2, line 17, after "circuit" insert --of--.

Col. 3, line 27, delete ")";
       line 27, after "inverter" insert --)--;
       line 48, after "$N_2$" insert --,--;
       line 49, after "$N_3$" insert --,--;
       line 64, "an" should be --the--.

Col. 4, line 12, "of second" should be --of the second--;
       line 13, after "$N_3$" insert --,--;
       line 56, after "3" insert --,--;
       line 62, after "as" insert --has--.

UNITED STATES PATENT AND TRADEMARK OFFICE
CERTIFICATE OF CORRECTION

PATENT NO. : 4,366,398

DATED : December 28, 1982

INVENTOR(S) : Asami

Page 2 of 2

It is certified that error appears in the above-identified patent and that said Letters Patent is hereby corrected as shown below:

Col. 5, line 8, delete ",";
      line 11, after "invention" insert --,--;
      line 27, after "OFF," insert --the--;
      line 28, "OFF the" should be "the OFF";

Col. 7, line 4, after "conveying" insert --a--.

Signed and Sealed this

Twenty-fourth Day of May 1983

[SEAL]

*Attest:*

DONALD J. QUIGG

*Attesting Officer*    *Acting Commissioner of Patents and Trademarks*